US011352383B2

(12) United States Patent
Ermert et al.

(10) Patent No.: US 11,352,383 B2
(45) Date of Patent: Jun. 7, 2022

(54) GROUP VI PRECURSOR COMPOUNDS

(71) Applicant: ENTEGRIS, INC., Billerica, MA (US)

(72) Inventors: David M. Ermert, Danbury, CT (US); Thomas H. Baum, New Fairfield, CT (US); Robert Wright, Jr., Newtown, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/803,547

(22) Filed: Feb. 27, 2020

(65) Prior Publication Data

US 2020/0270289 A1 Aug. 27, 2020

Related U.S. Application Data (60) Provisional application No. 62/811,229, filed on Feb. 27, 2019.

(51) Int. Cl.
  *C07F 11/00* (2006.01)
  *H01L 21/3205* (2006.01)
  *H01L 21/02* (2006.01)

(52) U.S. Cl.
  CPC ........ *C07F 11/00* (2013.01); *H01L 21/02192* (2013.01); *H01L 21/32051* (2013.01)

(58) Field of Classification Search
  None
  See application file for complete search history.

(56) References Cited

U.S. PATENT DOCUMENTS

| | | | | |
|---|---|---|---|---|
| 3,256,184 | A | * | 6/1966 | Kassinger ................ C07F 9/04 508/359 |
| 2013/0197245 | A1 | * | 8/2013 | Umbarkar ............. C07C 45/294 549/525 |
| 2017/0268107 | A1 | | 9/2017 | Lansalot-Matras |
| 2019/0177259 | A1 | * | 6/2019 | Gao ........................ C07C 45/29 |
| 2019/0368039 | A1 | * | 12/2019 | Arteaga ................. C07F 11/00 |

FOREIGN PATENT DOCUMENTS

TW 201806957 A 3/2018
WO WO-2019232344 A1 * 12/2019 ......... C23C 16/4481

OTHER PUBLICATIONS

Arnaiz, et al. entitled "Addition compounds of dichlorodioxomolybdenum(VI) from hydrochloric acid solutions of molybdenum trioxide. Crystal structure of dichlorodioxodiaaquamolybdenum(VI) bis(2,5,8-trioxanonane)" in Polyhedron, vol. 13, No. 19, pp. 2745-2749, 1994 (Year: 1994).*

(Continued)

*Primary Examiner* — Erik Kielin
(74) *Attorney, Agent, or Firm* — Entegris, Inc.

(57) ABSTRACT

The invention provides a facile process for preparing various Group VI precursor compounds useful in the vapor deposition of such Group VI metals onto solid substrates, especially microelectronic semiconductor device substrates. The process provides an effective means to obtain such volatile materials, which can then be sources of molybdenum, chromium, or tungsten-containing materials to be deposited on such substrates. Additionally, the invention provides a method for vapor deposition of such compounds onto microelectronic device substrates.

8 Claims, 5 Drawing Sheets

(56) References Cited

OTHER PUBLICATIONS

Dreisch, Klaus et al., "Synthesis of Mo2Cl2(N,N,N',N'-tetramethylethylenediamine) (M=Mo and W) and crystal structure of Wo2Cl2(N,N,N',N'-tetramethylethylenediamine) -an unprecedented coordination geometry in the Wo2Cl2 core", Polyhedron, 1992, vol. 11, No. 17, pp. 2143-2150.

Krauss, Hans-Ludwig et al., "About non-salt-like molybdenum (VI) complexes", Berichte der deutschen chemischen Gesellschaft, 1961, vol. 94, No. 11, pp. 2864-2876; English Abstract Only.

Kuhn, Fritz E. et al., "Bis-acetonitrile(dibromo)dioxomolybdenum(VI) and derivatives: synthesis, reactivity, structures and catalytic applications", Journal of Organometallic Chemistry, 1999, vol. 583, pp. 3-10.

Mair, M. L. Harikumaran et al., "Synthesis, spectral, thermal and electrochemical studies of oxomolybdenum(V) and dioxomolybdenum(VI) complexes of an azo dye derived from 4-amino-2,3-dimethyl-1-phenyl pyrazol-5-one", Indian Journal of Chemistry, 2008, vol. 47A, pp. 1787-1792.

Kamenar, B.; Penavić, M.; Korpar-Čolig, B.; Marković, B. Preparation and Crystal Structure of Two Oxo-Molybdenum Complexes with Dimethoxyethane. Inorganica Chimica Acta 1982, 65, L245-L247.

Arnaiz et al, "Addition compounds of dichlorodioxomolybdenum(VI) with sulfoxides. Molecular structure of [MoO2Cl2(Me2SO)2]" Inorganica Chimica Acta, 2003, 347, p. 33-40.

Oliveira et al, "Dichlorodioxomolybdenum(vi) complexes bearing oxygen-donor ligands as olefin epoxidation catalystst†" Dalton Transactions, 2015.

\* cited by examiner

GROUP VI PRECURSOR COMPOUNDS

FIELD OF THE INVENTION

The present invention relates to certain precursors for the vapor deposition of certain Group VI-containing materials and to a method for their preparation.

BACKGROUND OF THE INVENTION

In consequence of its characteristics of extremely high melting point, low coefficient of thermal expansion, low resistivity, and high thermal conductivity, Group VI metals such as molybdenum, chromium, and tungsten are increasingly utilized in the manufacture of semiconductor devices, including use in diffusion barriers, electrodes, photomasks, power electronics substrates, low-resistivity gates, flat-panel displays, and interconnects.

Such utility has motivated efforts to achieve deposition of molybdenum, chromium, and tungsten films for such applications that is characterized by high conformality of the deposited film and high deposition rate to accommodate efficient high-volume manufacturing operations. This in turn has enabled efforts to develop improved molybdenum and tungsten source reagents useful in vapor deposition operations, as well as improved process parameters utilizing such reagents.

SUMMARY OF THE INVENTION

The invention provides a facile process for preparing various Group VI precursor compounds useful in the vapor deposition of certain Group VI metals onto solid substrates, especially microelectronic semiconductor device substrates. The process provides an effective means to obtain and isolate such volatile solid or liquid materials, which can then be sources of molybdenum, chromium, or tungsten-containing materials to be deposited on such substrates. Additionally, the invention provides a method for vapor deposition of such compounds onto microelectronic device substrates.

BRIEF DESCRIPTION OF THE DRAWINGS

FIGS. 3 and 4 thus illustrate the process parameters under which Mo is preferentially deposited versus MoC.

DETAILED DESCRIPTION OF THE INVENTION

In a first aspect, the invention provides a process for preparing compounds of the Formula (I)

(I)

wherein M is chosen from molybdenum, chromium, and tungsten, X is chosen from fluoro, chloro, bromo, and iodo, and each $L_1$ and $L_2$ are the same or different and constitute:
  (i) a monodentate hydrocarbyl ligand coordinated with M, or
  (ii) are taken together to form a bidentate hydrocarbyl ligand coordinated with M; which comprises:
(A) contacting a compound of the formula with (a) water containing about 0.1% (w/w) to about 48% (w/w) of a compound of the formula HX, and (b) a compound of the formula $L_1$ and/or $L_2$; followed by
(B) isolation of the compound of Formula (I) as a solid or liquid.

As used herein, the term "hydrocarbyl" represents a $C_2$-$C_{16}$ group comprising carbon and hydrogen atoms and optionally containing at least one nitrogen, sulfur, or oxygen atom. Such hydrocarbyl groups may comprise straight- or branched-chain saturated, unsaturated, and polyunsaturated alkylene and cycloalkylene groups and may be substituted, for example, with one to five groups selected from $C_1$-$C_6$ alkoxy, carboxyl, nitro, amino, $C_2$-$C_6$ aminocarbonyl, $C_2$-$C_6$ amido, cyano, $C_2$-$C_7$-alkoxycarbonyl, $C_2$-$C_7$-alkanoyloxy, hydroxy, aryl, heteroaryl, thiol, thioether, $C_2$-$C_{10}$ dialkylamino, $C_3$-$C_{15}$ trialkylammonium, and halogen. The terms "$C_1$-$C_6$ alkoxy", "$C_2$-$C_7$-alkoxycarbonyl", and "$C_2$-$C_7$-alkanoyloxy" are used to denote groups corresponding to the structures —$OR^3$, —$CO_2R^3$, and —$OCOR^3$, respectively, wherein $R^3$ is $C_1$-$C_6$ alkyl or substituted $C_1$-$C_6$ alkyl. The terms "$C_2$-$C_{16}$ aminocarbonyl" and "$C_2$-$C_{16}$ amido" are used to denote groups corresponding to the structures —NH-$COR^4$, —$CONHR^4$, respectively, wherein $R^4$ is $C_1$-$C_7$ alkyl. As noted above, $L_1$ and $L_2$ comprise such hydrocarbyl groups, and contain at least one nitrogen, sulfur, or oxygen atom.

$L_1$ and $L_2$ are chosen independently and represent monodentate ligands or are taken together to form bidentate ligands. In general, $L_1$ and $L_2$ comprise a hydrocarbyl group having at least one oxygen, sulfur, or nitrogen atom. Such ligands may, for example, be chosen from t-butyl nitrile, toluene, tetrahydrofuran, and acetonitrile, and such groups optionally substituted by one or more groups chosen from halo, cyano, nitro, $C_1$-$C_6$ alky, $C_1$-$C_6$ alkoxy, tetrahydrofuran, $C_1$-$C_6$ alkoxycarbonyl, and phenyl. Further examples include 1,2-dimethoxyethane; 1,2-diethoxyethane; 1,2-dimethoxypropane; N,N-dimethylacetamide; N,N-dimethylformamide; N,N-dimethylcyanoacetamide; diamines and triamines such as N,N,N',N'-tetramethylethylenediamine, ethylenediamine, hexaethylene diamine, diethylene triamine, and diethylenetriamine; dimethylsulfoxide; and glycols such as ethylene glycol, propylene glycol, 1,2-propanediol, 1,3-propanediol, 1,4-butanediol, 1,5-pentanediol, and 1,6-hexanediol.

The step (B) isolation of the compound of Formula (I) may be effected by extraction of the compound from the aqueous reaction mixture with a water-immiscible solvent, followed by evaporation of solvent or crystallization. Alternately, a water-miscible solvent such as an alcohol (e.g., ethanol) may be added to the aqueous solution to induce precipitation of the desired compound of Formula (I). The solid compounds of Formula (I) may be purified if desired, by crystallization and/or vacuum sublimation.

It will be appreciated that the structure above depicting the compounds of the invention is drawn in a two-dimensional format, not necessarily representing its three-dimensional orientation.

Additionally, the compounds of Formula (I) once formed, may be reacted with additional/different compound(s) of formula $L_1$ and/or $L_2$ to form a different compound of Formula (I) via a displacement reaction. Accordingly, in a further embodiment, the invention provides the above process, further comprising the step of contacting the compound of the Formula (I) with a compound chosen from t-butyl nitrile, toluene, tetrahydrofuran, and acetonitrile, and such groups optionally substituted by one or more groups chosen from halo, cyano, nitro, $C_1$-$C_6$ alky, $C_1$-$C_6$ alkoxy, tetrahydrofuran, $C_1$-$C_6$ alkoxycarbonyl, and phenyl; 1,2-dimethoxyethane; 1,2-diethoxyethane; 1,2-dimethoxypropane; N,N-dimethylacetamide; N,N-dimethylformamide; N,N-dimethylcyanoacetamide; N,N,N',N'-tetramethylethylenediamine, ethylenediamine, hexaethylene diamine, diethylene triamine, and diethylenetriamine; dimethylsulfoxide; and ethylene glycol, propylene glycol, 1,2-propanediol, 1,3-propanediol, 1,4-butanediol, 1,5-pentanediol, and 1,6-hexanediol, to afford a compound of Formula (I) having a different ligand of formula $L_1$ and/or $L_2$.

In a further embodiment, the invention provides a compound of Formula (I)

Figure 1:
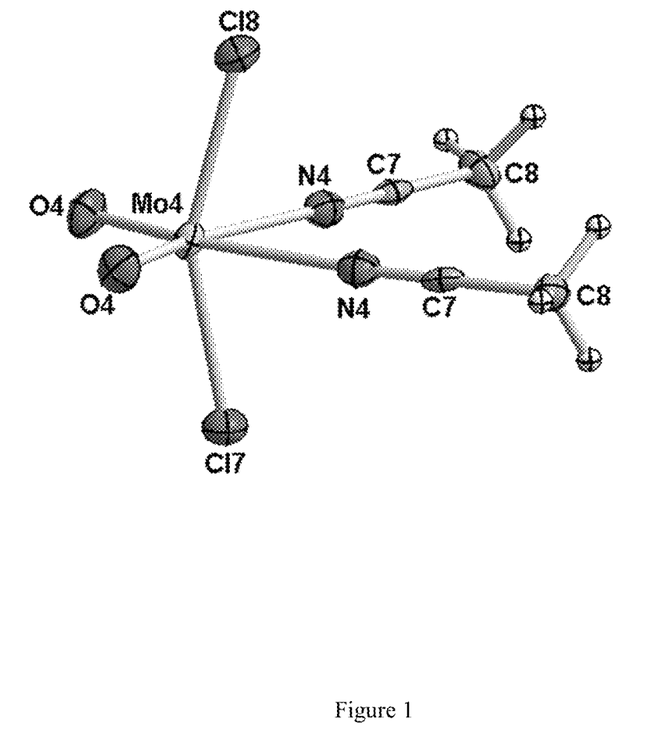
FIG. 1 is a three-dimensional solid-state crystal structure depiction of $MoO_2Cl_2(CH_3CN)_2$.
Figure 2:
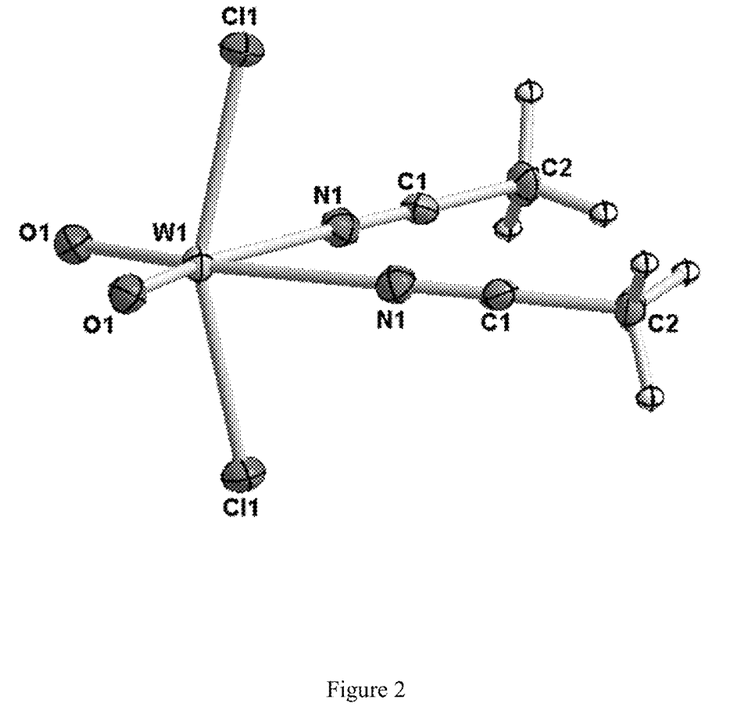
FIG. 2 is a three-dimensional solid-state crystal structure depiction of $WO_2Cl_2(CH_3CN)_2$.
Figure 3:
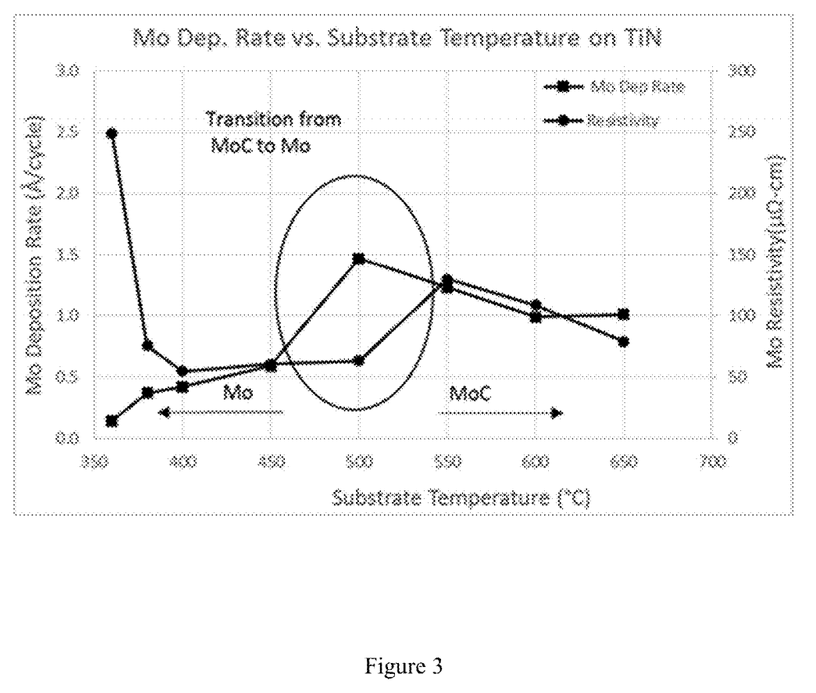
FIG. 3 is a plot of molybdenum deposition rate (Å/cycle) versus on substrate temperature (° C.) on a titanium nitride substrate using $MoO_2Cl_2(dimethoxyethane)$ as precursor.
Figure 4:
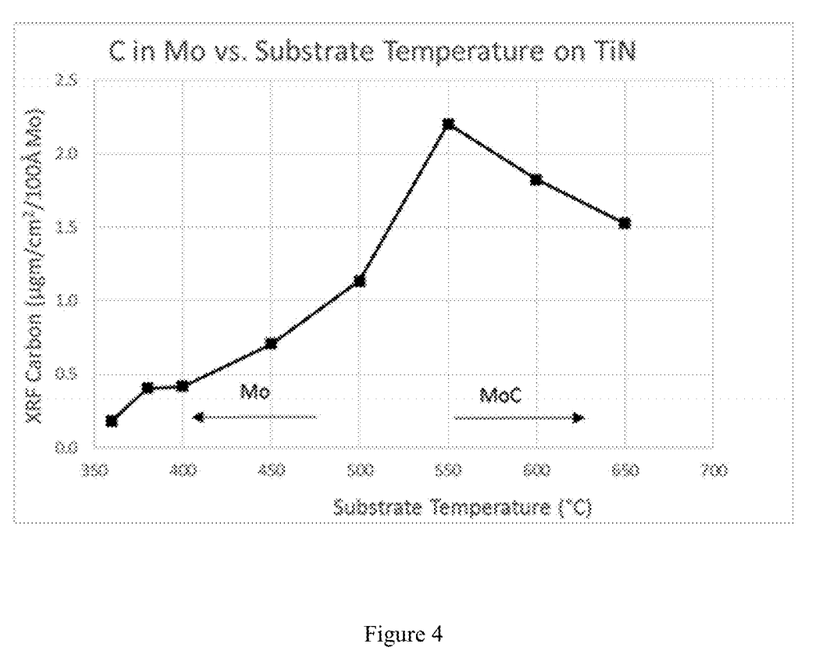
FIG. 4 is a plot of XRF Carbon (X-ray fluorescence analysis for carbon) (μgm/cm²/100 Å Mo) versus substrate temperature (° C.) on a titanium nitride substrate using $MoO_2Cl_2(dimethoxyethane)_2$ as precursor.
Figure 5:
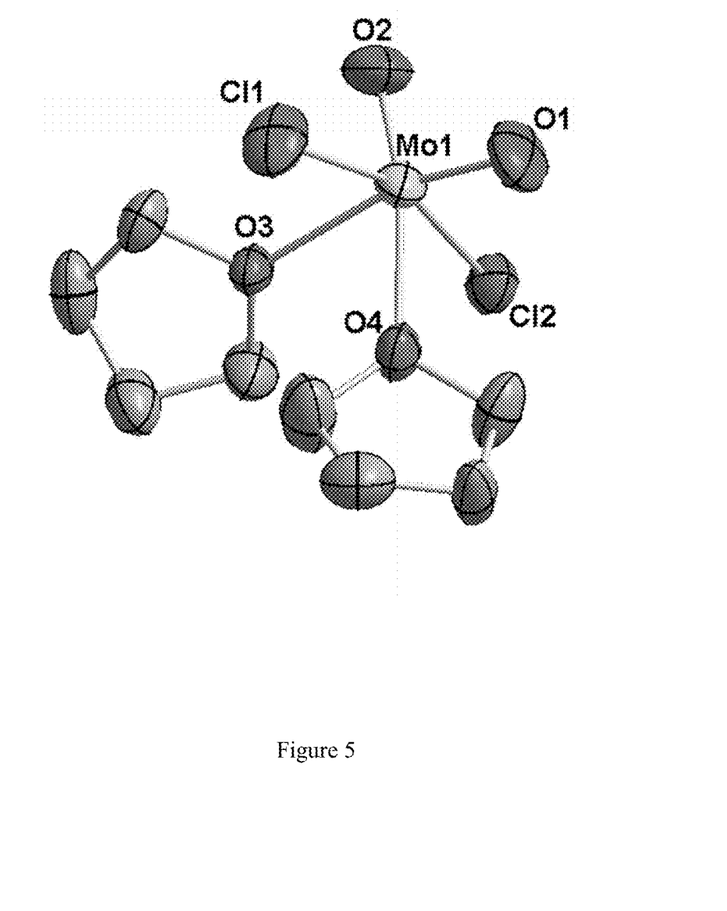
FIG. 5 is a three-dimensional solid-state crystal structure depiction of $MoO_2Cl_2(tetrahydrofuran)_2$.

(I)

wherein M is chosen from molybdenum, chromium, and tungsten, X is chosen from fluoro, chloro, bromo, and iodo, and each $L_1$ and $L_2$ are the same or different and constitute:

(i) a monodentate hydrocarbyl ligand coordinated with M, or (ii) are taken together to form a bidentate hydrocarbyl ligand coordinated with M; in solid or liquid form. In certain embodiments the compound of Formula (I) possesses less than about 3 weight percent impurities. In other embodiments, the compound of Formula (I) possesses less than 1 weight percent impurities. In other embodiments, the compound of Formula (I) is isolated in crystalline form. Particular examples of such crystalline forms of the compounds of Formula (I) include $MoO_2Cl_2(CH_3CN)_2$ and $WO_2Cl_2(CH_3CN)_2$ and $MoO_2Cl_2(tetrahydrofuran)_2$. In a further embodiment, the invention provides a compound having the formula $MoO_2Cl_2(CH_3CN)_2$ in crystalline form and having the x-ray crystallographic structure as shown in FIG. 1. In a further embodiment, the invention provides a compound having the formula $WO_2Cl_2(CH_3CN)_2$ in crystalline form and having the x-ray crystallographic structure as shown in FIG. 2. In a further embodiment, the invention provides a compound having the formula $MoO_2Cl_2(tetrahydrofuran)_2$ in crystalline form and having the x-ray crystallographic structure as shown in FIG. 5. These crystalline forms are further characterized in the Experimental Section below.

In a further embodiment, the invention provides a compound having the formula $MoO_2Cl_2(CH_3CN)_2$, and having an orthorhombic crystal system, and unit cell dimensions of about

| a = 12.0350(8) Å | α = 90° |
| b = 11.5956(9) Å | β = 90° |
| c = 26.5807(15) Å | γ = 90°. |

In a further embodiment, the invention provides a compound having the formula $WO_2Cl_2(CH_3CN)_2$, and having an orthorhombic crystal system, and unit cell dimensions of about

| a = 8.7091(6) Å | α = 90° |
| b = 8.2536(7) Å | β = 90° |
| c = 12.8021(8) Å | γ = 90°. |

In a further embodiment, the invention provides a compound having the formula $MoO_2C_2(tetrahydrofuran)_2$, and having an orthorhombic crystal system, and unit cell dimensions of about

| a = 7.4048(4) Å | α = 90° |
| b = 12.5437(6) Å | β = 90° |
| c = 13.7487(7) Å | γ = 90°. |

As used herein the term "unit cell" refers to the smallest and simplest volume element of a crystal that is completely representative of the unit of pattern of the crystal. The dimensions of the unit cell are defined by six numbers: dimensions a, b, and c and angles α, β, and γ. A crystal is an efficiently packed array of many unit cells.

As used herein, the term "orthorhombic unit cell" refers to a unit cell wherein a≠b≠c; α=β=γ=90°.

As used herein, "crystal lattice" refers to the array of points defined by the vertices of packed unit cells, as determined by single-crystal x-ray diffraction analysis.

As used herein, "space group" refers to the symmetry of a unit cell. In a space group designation (e.g., C2) the capital letter indicates the lattice type and the other symbols represent symmetry operations that can be carried out on the unit cell without changing its appearance.

In the process of the invention, suitable water-immiscible solvents include dichloromethane, ethyl acetate, diethyl ether, toluene, benzene, pentane, and the like.

In one embodiment, the process is conducted at elevated temperatures, for example from about 20° C. to about 100° C.

The compounds of Formula (I) may also be prepared by utilizing a starting material of the formula i.e., compounds of the general formula $A_2MO_4$, wherein M is chosen from chromium, molybdenum, or tungsten, and A is chosen from group I and II metal or ammonium cations. Examples of such cations include $Li^+$, $Na^+$, $K^+$, $NH_4^+$, alkylammonium compounds, and the like. Such compounds can be similarly reacted with HX in the presence of a compound of the formula $L_1$ and/or $L_2$ to afford the desired precursor compounds.

The process of the invention affords certain compounds which are in turn useful in the vapor deposition of certain Group VI metals onto various substrates, including microelectronic semiconductor device substrates. Thus, in another aspect, the invention provides a process for forming a material on a substrate, comprising contacting the substrate with a compound of the Formula (I)

(I)

wherein M is chosen from molybdenum, chromium, and tungsten, X is chosen from fluoro, chloro, bromo, and iodo, and each $L_1$ and $L_2$ are the same or different and constitute:

(i) a monodentate hydrocarbyl ligand coordinated with M, or (ii) are taken together to form a bidentate hydrocarbyl ligand coordinated with M; depositing the molybdenum, chromium, or tungsten-containing material onto the substrate, under vapor deposition conditions.

The substrate utilized in the deposition process of the invention may be of any suitable type, and may for example comprise a semiconductor device substrate, e.g., a silicon substrate, a silicon dioxide substrate, or other silicon-based substrate. In various embodiments, the substrate may comprise one or more metallic or dielectric substrates, for example, Co, Cu, Al, W, WN, WC, TiN, Mo, MoC, $SiO_2$, W, SiN, WCN, $Al_2O_3$, AlN, $ZrO_2$, $HfO_2$, $SiO_2$, lanthanum oxide ($La_2O_3$), tantalum nitride (TaN), ruthenium oxide ($RuO_2$), iridium oxide ($IrO_2$), niobium oxide ($Nb_2O_3$), and yttrium oxide ($Y_2O_3$).

In certain embodiments, for example in the case of an oxide substrate such as silicon dioxide, or alternatively a silicon or polysilicon substrate, the substrate may be processed or fabricated to include a barrier layer thereon, e.g., titanium nitride, for subsequently deposited material.

In one embodiment, the molybdenum, chromium, or tungsten-containing layer deposited on the substrate surface may for example be formed by pulsed chemical vapor deposition (CVD) or atomic layer deposition (ALD) or other vapor deposition technique, without the prior formation of a nucleation layer and thus directly with vapor derived from the compounds of Formula (I). The respective Formula (I) vapor contacting steps may be carried out alternatingly and repetitively for as many cycles as are desired to form the desired thickness of the molybdenum, chromium, or tungsten film. In various embodiments, the contact of the substrate (e.g., titanium nitride) layer with such vapor is conducted at temperature as low as 350°, and in other embodiments in a range of from 300° C. to 750° C.

With vapor derived from compounds of Formula (I), the molybdenum, chromium, or tungsten-containing material can be deposited directly onto the substrate to form a bulk deposit of elemental molybdenum, chromium, or tungsten or their corresponding oxides. The concentration of $H_2$ is critical towards the formation of metal or oxide, as greater than four molar equivalents or an excess of $H_2$ is required for metal formation. Less than four (4) molar equivalents of $H_2$ will result in the formation of varying amounts of an oxide of such metals, and thus will require further exposure to $H_2$ in order to reduce the metal oxide thus formed.

In various embodiments, the molybdenum, chromium, or tungsten-containing material is deposited on the substrate surface at temperature in a range of from 300° C. to 750° C. The process may be carried out so that the vapor deposition conditions produce deposition of elemental molybdenum, chromium, or tungsten as the metal-containing material on the substrate. The vapor deposition conditions may be of any suitable character, and may for example comprise presence of hydrogen or other reducing gas, to form a bulk layer of elemental molybdenum, chromium, or tungsten on the substrate.

More generally, the broad method of forming a molybdenum, chromium, or tungsten-containing material on a substrate in accordance with the present disclosure may comprise vapor deposition conditions comprising presence of hydrogen or other reducing gas. The molybdenum, chromium, or tungsten-containing material may be deposited on the barrier layer or surface in the presence or absence of hydrogen. For example, the barrier layer may be constituted by titanium nitride, and the titanium nitride layer may be contacted with vapor derived from the compounds of Formula (I) in the presence of hydrogen.

In another embodiment, an oxidizing co-reactant such as oxygen may be added to the process when using compounds of Formula (I) as a means of depositing a metal oxide thin film, such as $MoO_2$, $WO_3$, and $Cr_2O_3$.

It will be appreciated that the method of the present invention may be carried out in numerous alternative ways, and under a wide variety of process conditions. The process of the invention may for example be carried out in a process for making a semiconductor device on the substrate. The semiconductor device may be of any suitable type, and may for example comprise a DRAM device, 3-D NAND device, or other device or device integrated structure. In various embodiments, the substrate may comprise a via in which the molybdenum-containing material is deposited. The device may, for example, have an aspect ratio of depth to lateral dimension that is in a range of from 10:1 to 40:1. In still other embodiments, the device may be a film used in a flat-panel display or mobile device.

The process chemistry for depositing molybdenum-containing material in accordance with the present invention may include deposition of elemental molybdenum, Mo(0), by the reaction $2\ MO_2Cl_2[(L_1)(L_2)]+6H_2 \rightarrow 2M$ (wherein M=molybdenum, chromium, or tungsten)+$4HCl+4H_2O$. The molybdenum, chromium, or tungsten-containing material (M) deposited in accordance with the method of the present invention may be characterized by any appropriate evaluation metrics and parameters, such as deposition rate of the molybdenum, chromium, or tungsten-containing material, film resistivity of the deposited molybdenum, chromium, or tungsten-containing material, film morphology of the deposited molybdenum, chromium, or tungsten-containing material, film stress of the deposited molybdenum, chromium, or tungsten-containing material, step coverage of the material, and the process window or process envelope of appropriate process conditions. Any appropriate evaluation metrics and parameters may be employed, to characterize the deposited material and correlate same to specific process conditions, to enable mass production of corresponding semiconductor products. Advantageously, the process of the invention is capable of depositing a film of high purity molybdenum, chromium, or tungsten onto a semiconductor device. Accordingly, in a further aspect, the invention provides a semiconductor device having a molybdenum film deposited thereon, wherein said film comprises greater than 99% molybdenum, chromium, or tungsten.

In certain embodiments, the disclosure relates to a method of forming a molybdenum, chromium, or tungsten-containing material on a substrate, comprising depositing molybdenum, chromium, or tungsten on the substrate surface by a chemical vapor deposition (CVD) process utilizing precursor compounds of Formula (I), to produce the molybdenum, chromium, or tungsten-containing material on the substrate.

Such process may be carried out in any suitable manner as variously described herein. In specific embodiments, such method may be conducted with a vapor deposition process comprising chemical vapor deposition, e.g., pulsed chemical vapor deposition. The method may be carried out so that the resulting molybdenum, chromium, or tungsten-containing material is composed essentially of elemental molybdenum, chromium, or tungsten, and in various embodiments the molybdenum, chromium, or tungsten may be deposited on the substrate surface in the presence of hydrogen or other suitable reducing gas. In other embodiments of the invention, the precursors of Formula (I) and reducing gas may be pulsed sequentially to deposit he molybdenum film on pulsing with the pulse sequence being optimized for film conformality and film resistivity. The method may be carried out in the manufacture of a semiconductor device product, such as a DRAM device, or a 3-D NAND, a logic device, a flat-panel display, or an IC packaging component.

Generally, the methods of the present disclosure for forming molybdenum, chromium, or tungsten-containing material on a substrate may be carried out to achieve deposition of the molybdenum, chromium, or tungsten-containing material at high levels of step coverage, e.g., step coverage ranging from about 75% to about 100%.

This invention can be further illustrated by the following examples of preferred embodiments thereof, although it will be understood that these examples are included merely for purposes of illustration and are not intended to limit the scope of the invention unless otherwise specifically indicated.

Experimental Section

Using the following general procedure, the compounds of Formula (I) may be prepared:

Synthetic Procedure No. 1.

$MoO_3$ (20.0 g, 138 mmol) was loaded into a 500 mL round bottom flask equipped with a magnetic stir bar. HCl (200 mL, 37%) was added directly to the $MoO_3$, the reaction flask outfitted with a water-cooled condenser (5° C.), and the resulting light-green suspension was heated to near reflux (95° C.) using an oil bath. After ~2 hours the reaction presented as a clear light-green solution. The reaction was cooled to room temperature before being placed in an ice bath. At this point, DME (50 mL) was added directly to the cooled solution and the reaction was warmed to room temperature and stirred overnight. The following morning the light-green solution was poured into a 1 L separation funnel and extracted with DCM (2×200 mL). The organic layers were combined, dried using $MgSO_4$, filtered, placed in a 1 L round-bottom flask equipped with a magnetic stir bar, and the solvent removed under reduced pressure to yield $MoO_2Cl_2$(dimethoxyethane) as an off-white solid. Mass=12.68 g, Yield=31.8%. The product may be purified by vacuum sublimation (80° C. @ 25 mTorr). NMR (400 MHz, $C_6D_6$, 298K): δ 3.29 (s, 6H); 2.78 (s, 4H) ppm. $^{13}C$ {1H} NMR (100 MHz, $C_6D_6$, 298K): δ 70.68, 64.13 ppm.

Synthetic Procedure No. 2

Of the general formula $A_2MO_4$, where M=chromium, molybdenum, or tungsten and A=lithium, sodium, or potassium.

Here, the general synthetic procedure and workup are very similar to procedure No. 1.

i.e., compounds of the general formula $A_2MO_4$, wherein M is chosen from chromium, molybdenum, or tungsten, and A is chosen group I and II metals, or ammonium cations. Examples include $Li^+$, $Na^+$, $K^+$, $NH_4^+$, alkylammonium compounds, and the like.

Synthetic Procedure No. 3

Ligand substitution can be utilized to synthesize the compounds of Formula (I). For example; the $MoO_2Cl_2$(N,N-dimethylformamide)$_2$ complex can be made using Procedure No. 1 above, and then the N,N-dimethylformamide ligands substituted for dimethoxyethane via solvolysis to generate $MoO_2Cl_2$(dimethoxyethane).

As noted above, FIG. 1 is a three-dimensional solid-state crystal structure depiction of $MoO_2Cl_2(CH_3CN)_2$. This compound was subjected to x-ray crystallographic analysis and yielded the following data:

TABLE 1

Crystal data and structure refinement for $MoO_2Cl_2(CH_3CN)_2$.

| | | |
|---|---|---|
| Identification code | NB00618-002 | |
| Empirical formula | C4 H6 Cl2 Mo N2 O2 | |
| Formula weight | 280.95 | |
| Temperature | 100.0 K | |
| Wavelength | 0.71073 Å | |
| Crystal system | Orthorhombic | |
| Space group | Pnma | |
| Unit cell dimensions | a = 12.0350(8) Å | α = 90°. |
| | b = 11.5956(9) Å | β = 90°. |
| | c = 26.5807(15) Å | γ = 90°. |
| Volume | 3709.4(4) Å$^3$ | |
| Z,Z' | 16, 4 | |

TABLE 1-continued

Crystal data and structure refinement for $MoO_2Cl_2(CH_3CN)_2$.

| | |
|---|---|
| Density (calculated) | 2.012 $Mg/m^3$ |
| Absorption coefficient | 1.945 $mm^{-1}$ |
| F(000) | 2176 |
| Crystal size | 0.24 × 0.19 × 0.18 $mm^3$ |
| Theta range for data collection | 1.857 to 26.718°. |
| Index ranges | −15 <= h <= 15, −14 <= k <= 14, −33 <= l <= 32 |
| Reflections collected | 22254 |
| Independent reflections | 4134 [R(int) = 0.0475] |
| Completeness to theta = 25.242° | 99.9% |
| Absorption correction | Semi-empirical from equivalents |
| Max. and min. transmission | 0.7454 and 0.6516 |
| Refinement method | Full-matrix least-squares on $F^2$ |
| Data/restraints/parameters | 4134/0/222 |
| Goodness-of-fit on $F^2$ | 1.008 |
| Final R indices [I > 2sigma(I)] | R1 = 0.0258, wR2 = 0.0518 |
| R indices (all data) | R1 = 0.0388, wR2 = 0.0558 |
| Extinction coefficient | 0.00013(2) |
| Largest diff. peak and hole | 0.492 and −0.462e · $Å^{-3}$ |

TABLE 2

Atomic coordinates (×$10^4$) and equivalent isotropic displacement parameters ($Å^2$ × $10^3$) . . . U(eq) is defined as one third of the trace of the orthogonalized $U^{ij}$ tensor.

| | x | y | z | U(eq) |
|---|---|---|---|---|
| Mo(4) | 7248(1) | 2500 | 4414(1) | 10(1) |
| Mo(2) | 2330(1) | 7500 | 3151(1) | 10(1) |
| Mo(1) | 2455(1) | 2500 | 3069(1) | 11(1) |
| Mo(3) | 7667(1) | 7500 | 4464(1) | 12(1) |
| Cl(2) | 4372(1) | 2500 | 2868(1) | 17(1) |
| Cl(3) | 1038(1) | 7500 | 2486(1) | 19(1) |
| Cl(4) | 4104(1) | 7500 | 3531(1) | 15(1) |
| Cl(5) | 5845(1) | 7500 | 4786(1) | 20(1) |
| Cl(7) | 7535(1) | 2500 | 3536(1) | 17(1) |
| Cl(8) | 7804(1) | 2500 | 5264(1) | 16(1) |
| Cl(1) | 877(1) | 2500 | 3592(1) | 19(1) |
| Cl(6) | 9054(1) | 7500 | 3833(1) | 19(1) |
| O(1) | 2102(2) | 3651(1) | 2715(1) | 19(1) |
| N(2) | 3254(2) | 6256(2) | 2597(1) | 13(1) |
| N(1) | 3109(2) | 3737(2) | 3706(1) | 16(1) |
| N(3) | 6849(2) | 8742(2) | 3887(1) | 16(1) |
| O(4) | 6389(2) | 1350(2) | 4438(1) | 18(1) |
| O(3) | 8142(2) | 6347(2) | 4788(1) | 21(1) |
| C(2) | 3871(2) | 5026(2) | 4428(1) | 17(1) |
| C(1) | 3436(2) | 4302(2) | 4022(1) | 13(1) |
| C(4) | 4342(2) | 4940(2) | 1977(1) | 18(1) |
| C(7) | 9534(2) | 4320(2) | 4355(1) | 10(1) |
| N(4) | 8773(2) | 3745(2) | 4367(1) | 15(1) |
| C(8) | 10517(2) | 5057(2) | 4342(1) | 15(1) |
| O(2) | 1813(2) | 8648(2) | 3461(1) | 19(1) |
| C(3) | 3728(2) | 5680(2) | 2325(1) | 13(1) |
| C(6) | 5822(2) | 10073(2) | 3259(1) | 17(1) |
| C(5) | 6407(2) | 9324(2) | 3608(1) | 12(1) |

TABLE 3

Bond lengths [Å] and angles [°] for $MoO_2Cl_2(CH_3CN)$.

| | |
|---|---|
| Mo(4)—Cl(7) | 2.3601(9) |
| Mo(4)—Cl(8) | 2.3561(9) |
| Mo(4)—O(4) | 1.6885(17) |
| Mo(4)—O(4)#1 | 1.6885(17) |
| Mo(4)—N(4)#1 | 2.338(2) |
| Mo(4)—N(4) | 2.338(2) |
| Mo(2)—Cl(3) | 2.3547(9) |
| Mo(2)—Cl(4) | 2.3623(9) |
| Mo(2)—N(2) | 2.343(2) |
| Mo(2)—N(2)#2 | 2.343(2) |
| Mo(2)—O(2) | 1.6846(17) |
| Mo(2)—O(2)#2 | 1.6846(17) |
| Mo(1)—Cl(2) | 2.3672(10) |
| Mo(1)—Cl(1) | 2.3534(10) |
| Mo(1)—O(1)#1 | 1.6867(17) |
| Mo(1)—O(1) | 1.6867(17) |
| Mo(1)—N(1) | 2.355(2) |
| Mo(1)—N(1)#1 | 2.355(2) |
| Mo(3)—Cl(5) | 2.3528(10) |
| Mo(3)—Cl(6) | 2.3671(10) |
| Mo(3)—N(3) | 2.323(2) |
| Mo(3)—N(3)#2 | 2.323(2) |
| Mo(3)—O(3)#2 | 1.6885(17) |
| Mo(3)—O(3) | 1.6885(17) |
| N(2)—C(3) | 1.137(3) |
| N(1)—C(1) | 1.135(3) |
| N(3)—C(5) | 1.134(3) |
| C(2)—C(1) | 1.462(3) |
| C(4)—C(3) | 1.462(3) |
| C(7)—N(4) | 1.133(3) |
| C(7)—C(8) | 1.461(3) |
| C(6)—C(5) | 1.453(3) |
| Cl(8)—Mo(4)—Cl(7) | 155.09(4) |
| O(4)#1-Mo(4)—Cl(7) | 97.26(6) |
| O(4)—Mo(4)—Cl(7) | 97.26(6) |
| O(4)#1-Mo(4)—Cl(8) | 97.95(6) |
| O(4)—Mo(4)—Cl(8) | 97.94(6) |
| O(4)#1-Mo(4)—O(4) | 104.33(13) |
| O(4)#1-Mo(4)—N(4)#1 | 165.97(8) |
| O(4)—Mo(4)—N(4) | 165.97(8) |
| O(4)—Mo(4)—N(4)#1 | 89.70(8) |
| O(4)#1-Mo(4)—N(4) | 89.70(8) |
| N(4)—Mo(4)—Cl(7) | 80.39(5) |
| N(4)#1-Mo(4)—Cl(7) | 80.39(5) |
| N(4)—Mo(4)—Cl(8) | 80.08(5) |
| N(4)#1-Mo(4)—Cl(8) | 80.08(5) |
| N(4)—Mo(4)—N(4)#1 | 76.27(11) |
| Cl(3)—Mo(2)—Cl(4) | 156.61(3) |
| N(2)—Mo(2)—Cl(3) | 80.86(5) |
| N(2)#2-Mo(2)—Cl(3) | 80.86(5) |
| N(2)—Mo(2)—Cl(4) | 80.76(5) |
| N(2)#2-Mo(2)—Cl(4) | 80.76(5) |
| N(2)#2-Mo(2)—N(2) | 76.03(10) |
| O(2)#2-Mo(2)—Cl(3) | 97.08(6) |
| O(2)—Mo(2)—Cl(3) | 97.08(6) |
| O(2)—Mo(2)—Cl(4) | 97.18(7) |
| O(2)#2-Mo(2)—Cl(4) | 97.18(7) |
| O(2)#2-Mo(2)—N(2) | 89.75(8) |
| O(2)—Mo(2)—N(2)#2 | 89.75(8) |
| O(2)—Mo(2)—N(2) | 165.78(8) |
| O(2)#2-Mo(2)—N(2)#2 | 165.78(8) |
| O(2)#2-Mo(2)—O(2) | 104.47(12) |
| Cl(1)—Mo(1)—Cl(2) | 156.82(4) |
| Cl(1)—Mo(1)—N(1)#1 | 81.08(6) |
| Cl(1)—Mo(1)—N(1) | 81.08(6) |

TABLE 3-continued

Bond lengths [Å] and angles [°] for $MoO_2Cl_2(CH_3CN)$.

| | |
|---|---|
| O(1)—Mo(1)—Cl(2) | 96.88(6) |
| O(1)#1-Mo(1)—Cl(2) | 96.88(6) |
| O(1)#1-Mo(1)—Cl(1) | 97.24(6) |
| O(1)—Mo(1)—Cl(1) | 97.24(6) |
| O(1)#1-Mo(1)—O(1) | 104.56(12) |
| O(1)—Mo(1)—N(1)#1 | 165.24(8) |
| O(1)#1-Mo(1)—N(1)#1 | 90.19(8) |
| O(1)—Mo(1)—N(1) | 90.20(8) |
| O(1)#1-Mo(1)—N(1) | 165.24(8) |
| N(1)#1-Mo(1)—Cl(2) | 80.59(6) |
| N(1)—Mo(1)—Cl(2) | 80.59(6) |
| N(1)#1-Mo(1)—N(1) | 75.05(10) |
| Cl(5)—Mo(3)—Cl(6) | 156.17(4) |
| N(3)#2-Mo(3)—Cl(5) | 81.11(6) |
| N(3)—Mo(3)—Cl(5) | 81.11(6) |
| N(3)—Mo(3)—Cl(6) | 80.24(6) |
| N(3)#2-Mo(3)—Cl(6) | 80.24(6) |
| N(3)#2-Mo(3)—N(3) | 76.59(10) |
| O(3)#2-Mo(3)—Cl(5) | 97.49(7) |
| O(3)—Mo(3)—Cl(5) | 97.49(7) |
| O(3)—Mo(3)—Cl(6) | 97.00(7) |
| O(3)#2-Mo(3)—Cl(6) | 97.00(7) |
| O(3)#2-Mo(3)—N(3) | 89.38(8) |
| O(3)—Mo(3)—N(3) | 165.95(8) |
| O(3)—Mo(3)—N(3)#2 | 89.38(8) |
| O(3)#2-Mo(3)—N(3)#2 | 165.95(8) |
| O(3)#2-Mo(3)—O(3) | 104.65(13) |
| C(3)—N(2)—Mo(2) | 177.7(2) |
| C(1)—N(1)—Mo(1) | 177.7(2) |
| C(5)—N(3)—Mo(3) | 177.0(2) |
| N(1)—C(1)—C(2) | 179.3(3) |
| N(4)—C(7)—C(8) | 179.7(3) |
| C(7)—N(4)—Mo(4) | 177.4(2) |
| N(2)—C(3)—C(4) | 179.7(3) |
| N(3)—C(5)—C(6) | 178.8(3) |

Symmetry transformations used to generate equivalent atoms:
1 x, −y + 1/2, z
2 x, −y + 3/2, z

TABLE 4

Anisotropic displacement parameters ($Å^2 \times 10^3$) for $MoO_2Cl_2(CH_3CN)$. The anisotropic displacement factor exponent takes the form: $-2\pi^2[h^2 a^{*2}U^{11} + \ldots + 2 h k a^* b^* U^{12}]$

| | $U^{11}$ | $U^{22}$ | $U^{33}$ | $U^{23}$ | $U^{13}$ | $U^{12}$ |
|---|---|---|---|---|---|---|
| Mo(4) | 9(1) | 9(1) | 13(1) | 0 | 2(1) | 0 |
| Mo(2) | 9(1) | 10(1) | 10(1) | 0 | 3(1) | 0 |
| Mo(1) | 13(1) | 10(1) | 10(1) | 0 | −3(1) | 0 |
| Mo(3) | 15(1) | 9(1) | 11(1) | 0 | −4(1) | 0 |

TABLE 4-continued

Anisotropic displacement parameters ($Å^2 \times 10^3$) for $MoO_2Cl_2(CH_3CN)$. The anisotropic displacement factor exponent takes the form: $-2\pi^2[h^2 a^{*2}U^{11} + \ldots + 2 h k a^* b^* U^{12}]$

| | $U^{11}$ | $U^{22}$ | $U^{33}$ | $U^{23}$ | $U^{13}$ | $U^{12}$ |
|---|---|---|---|---|---|---|
| Cl(2) | 16(1) | 18(1) | 17(1) | 0 | 3(1) | 0 |
| Cl(3) | 12(1) | 23(1) | 22(1) | 0 | −4(1) | 0 |
| Cl(4) | 13(1) | 18(1) | 13(1) | 0 | −1(1) | 0 |
| Cl(5) | 20(1) | 19(1) | 21(1) | 0 | 3(1) | 0 |
| Cl(7) | 19(1) | 20(1) | 13(1) | 0 | 0(1) | 0 |
| Cl(8) | 19(1) | 17(1) | 13(1) | 0 | 2(1) | 0 |
| Cl(1) | 15(1) | 20(1) | 23(1) | 0 | 4(1) | 0 |
| Cl(6) | 17(1) | 20(1) | 21(1) | 0 | 2(1) | 0 |
| O(1) | 21(1) | 16(1) | 21(1) | 5(1) | −4(1) | 1(1) |
| N(2) | 11(1) | 12(1) | 17(1) | 1(1) | −1(1) | 2(1) |
| N(1) | 18(1) | 14(1) | 17(1) | −2(1) | 0(1) | −1(1) |
| N(3) | 18(1) | 13(1) | 17(1) | −2(1) | −1(1) | 1(1) |
| O(4) | 17(1) | 15(1) | 21(1) | −1(1) | 3(1) | −5(1) |
| O(3) | 25(1) | 16(1) | 22(1) | 4(1) | −2(1) | 4(1) |
| C(2) | 20(2) | 16(2) | 17(2) | −5(1) | 0(1) | 1(1) |
| C(1) | 11(1) | 13(1) | 15(1) | 5(1) | 4(1) | 4(1) |
| C(4) | 21(2) | 16(2) | 16(1) | −2(1) | 4(1) | 2(1) |
| C(7) | 16(1) | 9(1) | 6(1) | 1(1) | 1(1) | 3(1) |
| N(4) | 17(1) | 14(1) | 13(1) | −1(1) | 0(1) | 2(1) |
| C(8) | 14(2) | 16(2) | 15(1) | 3(1) | −3(1) | −4(1) |
| O(2) | 17(1) | 21(1) | 20(1) | −4(1) | 5(1) | 3(1) |
| C(3) | 12(1) | 13(1) | 13(1) | 3(1) | −4(1) | −2(1) |
| C(6) | 18(2) | 15(2) | 18(1) | 7(1) | −3(1) | −1(1) |
| C(5) | 13(1) | 10(1) | 14(1) | −2(1) | 2(1) | −2(1) |

TABLE 5

Hydrogen coordinates ($\times 10^4$) and isotropic displacement parameters ($Å^2 \times 10^3$) for $MoO_2Cl_2(CH_3CN)$.

| | x | y | z | U(eq) |
|---|---|---|---|---|
| H(2A) | 3835 | 5837 | 4327 | 26 |
| H(2B) | 4645 | 4814 | 4496 | 26 |
| H(2C) | 3425 | 4910 | 4732 | 26 |
| H(4A) | 3937 | 4884 | 1658 | 27 |
| H(4B) | 4422 | 4169 | 2124 | 27 |
| H(4C) | 5080 | 5270 | 1916 | 27 |
| H(8A) | 10874 | 4995 | 4012 | 22 |
| H(8B) | 11040 | 4812 | 4604 | 22 |
| H(8C) | 10298 | 5860 | 4402 | 22 |
| H(6A) | 6256 | 10150 | 2949 | 26 |
| H(6B) | 5722 | 10835 | 3412 | 26 |
| H(6C) | 5094 | 9740 | 3181 | 26 |

As noted above, FIG. 2 is a three-dimensional solid-state crystal structure depiction of $WO_2Cl_2(CH_3CN)_2$.

TABLE 6

Crystal data and structure refinement for $WO_2Cl_2(CH_3CN)_2$.

| | | |
|---|---|---|
| Identification code | NB00666-001 | |
| Empirical formula | C4 H6 Cl2 N2 O2 W | |
| Formula weight | 368.86 | |
| Temperature | 100.0 K | |
| Wavelength | 0.71073 Å | |
| Crystal system | Orthorhombic | |
| Space group | Pbcn | |
| Unit cell dimensions | a = 8.7091(6) Å | α = 90°. |
| | b = 8.2536(7) Å | β = 90°. |
| | c = 12.8021(8) Å | γ = 90°. |
| Volume | 920.23(12) $Å^3$ | |
| Z | 4 | |
| Density (calculated) | 2.662 $Mg/m^3$ | |
| Absorption coefficient | 13.088 $mm^{-1}$ | |
| F(000) | 672 | |
| Crystal size | 0.37 × 0.35 × 0.33 $mm^3$ | |
| Theta range for data collection | 3.183 to 28.277°. | |
| Index ranges | −11 <= h <= 10, −11 <= k <= 6, −16 <= l <= 16 | |

TABLE 6-continued

Crystal data and structure refinement for $WO_2Cl_2(CH_3CN)_2$.

| | |
|---|---|
| Reflections collected | 5168 |
| Independent reflections | 1139 [R(int) = 0.0281] |
| Completeness to theta = 25.242° | 99.9% |
| Absorption correction | Semi-empirical from equivalents |
| Max. and min. transmission | 0.6035 and 0.3693 |
| Refinement method | Full-matrix least-squares on $F^2$ |
| Data/restraints/parameters | 1139/0/52 |
| Goodness-of-fit on $F^2$ | 1.133 |
| Final R indices [I > 2sigma(I)] | R1 = 0.0183, wR2 = 0.0431 |
| R indices (all data) | R1 = 0.0256, wR2 = 0.0459 |
| Extinction coefficient | n/a |
| Largest diff. peak and hole | 0.641 and −1.611e · Å$^{-3}$ |

TABLE 7

Atomic coordinates (×10$^4$) and equivalent isotropic displacement parameters (Å$^2$ × 10$^3$) for $WO_2Cl_2(CH_3CN)_2$. U(eq) is defined as one third of the trace of the orthogonalized U$^{ij}$ tensor.

| | x | y | z | U(eq) |
|---|---|---|---|---|
| W(1) | 5000 | 3420(1) | 2500 | 7(1) |
| Cl(1) | 7382(1) | 4003(1) | 3276(1) | 14(1) |
| O(1) | 5680(3) | 2149(3) | 1552(2) | 12(1) |
| N(1) | 4324(4) | 5646(4) | 3495(2) | 12(1) |
| C(2) | 3798(5) | 8375(4) | 4431(3) | 14(1) |
| C(1) | 4080(4) | 6841(4) | 3911(3) | 11(1) |

TABLE 8

Bond lengths [Å] and angles [°] for $WO_2Cl_2(CH_3CN)_2$.

| | |
|---|---|
| W(1)—Cl(1)#1 | 2.3502(9) |
| W(1)—Cl(1) | 2.3502(9) |
| W(1)—O(1)#1 | 1.710(3) |
| W(1)—O(1) | 1.710(3) |
| W(1)—N(1)#1 | 2.312(3) |
| W(1)—N(1) | 2.312(3) |
| N(1)—C(1) | 1.141(5) |
| C(2)—H(2A) | 0.9800 |
| C(2)—H(2B) | 0.9800 |
| C(2)—H(2C) | 0.9800 |
| C(2)—C(1) | 1.452(5) |
| Cl(1)—W(1)—Cl(1)#1 | 156.36(4) |
| O(1)—W(1)—Cl(1) | 96.89(9) |
| O(1)#1-W(1)—Cl(1) | 97.55(9) |
| O(1)—W(1)—Cl(1)#1 | 97.55(9) |
| O(1)#1-W(1)—Cl(1)#1 | 96.89(9) |
| O(1)—W(1)—O(1)#1 | 104.30(17) |
| O(1)—W(1)—N(1) | 165.20(12) |
| O(1)—W(1)—N(1)#1 | 90.48(11) |
| O(1)#1-W(1)—N(1) | 90.48(11) |
| O(1)#1-W(1)—N(1)#1 | 165.20(12) |
| N(1)—W(1)—Cl(1)#1 | 81.11(8) |
| N(1)#1-W(1)—Cl(1)#1 | 80.15(8) |
| N(1)#1-W(1)—Cl(1) | 81.11(8) |
| N(1)—W(1)—Cl(1) | 80.15(8) |
| N(1)—W(1)—N(1)#1 | 74.75(15) |
| C(1)—N(1)—W(1) | 172.6(3) |
| H(2A)—C(2)—H(2B) | 109.5 |

TABLE 8-continued

Bond lengths [Å] and angles [°] for $WO_2Cl_2(CH_3CN)_2$.

| | |
|---|---|
| H(2A)—C(2)—H(2C) | 109.5 |
| H(2B)—C(2)—H(2C) | 109.5 |
| C(1)—C(2)—H(2A) | 109.5 |
| C(1)—C(2)—H(2B) | 109.5 |
| C(1)—C(2)—H(2C) | 109.5 |
| N(1)—C(1)—C(2) | 178.8(4) |

Symmetry transformations used to generate equivalent atoms:
1 −x + 1, y, −z + 1/2

TABLE 9

Anisotropic displacement parameters (Å$^2$ × 10$^3$) for $WO_2Cl_2(CH_3CN)_2$. The anisotropic displacement factor exponent takes the form: $-2\pi^2[h^2 a^{*2}U^{11} + \ldots + 2 h k a^* b^* U^{12}]$

| | U$^{11}$ | U$^{22}$ | U$^{33}$ | U$^{23}$ | U$^{13}$ | U$^{12}$ |
|---|---|---|---|---|---|---|
| W(1) | 8(1) | 5(1) | 7(1) | 0 | −1(1) | 0 |
| Cl(1) | 11(1) | 14(1) | 16(1) | −1(1) | −4(1) | −1(1) |
| O(1) | 12(1) | 11(1) | 14(1) | −1(1) | −2(1) | 1(1) |
| N(1) | 10(2) | 12(2) | 12(2) | 0(1) | 0(1) | −1(1) |
| C(2) | 21(2) | 8(2) | 12(2) | −3(1) | −3(2) | 2(1) |
| C(1) | 11(2) | 11(2) | 11(2) | 1(1) | −4(2) | −2(1) |

TABLE 10

Hydrogen coordinates (×10$^4$) and isotropic displacement parameters (Å$^2$ × 10$^3$) for $WO_2Cl_2(CH_3CN)_2$.

| | x | y | z | U(eq) |
|---|---|---|---|---|
| H(2A) | 3864 | 9258 | 3921 | 16 |
| H(2B) | 4569 | 8540 | 4979 | 16 |
| H(2C) | 2772 | 8363 | 4744 | 16 |

As noted above, FIG. 5 is a three-dimensional solid-state crystal structure depiction of $MoO_2Cl_2(THF)_2$. (THF=tetrahydrofuran) This compound was subjected to x-ray crystallographic analysis and yielded the following data:

TABLE 11

Crystal data and structure refinement for $MoO_2Cl_2(THF)_2$.

| | |
|---|---|
| Empirical formula | C8 H16 Cl2 Mo O4 |
| Molecular formula | C8 H16 Cl2 Mo O4 |
| Formula weight | 343.05 |
| Temperature | 200 K |
| Wavelength | 0.71073 Å |
| Crystal system | Orthorhombic |
| Space group | P2$_1$2$_1$2$_1$ |

TABLE 11-continued

Crystal data and structure refinement for $MoO_2Cl_2(THF)_2$.

| | | |
|---|---|---|
| Unit cell dimensions | a = 7.4048(4) Å | ☐ = 90°. |
| | b = 12.5437(6) Å | ☐ = 90°. |
| | c = 13.7487(7) Å | ☐ = 90°. |
| Volume | 1277.03(11) Å$^3$ | |
| Z | 4 | |
| Density (calculated) | 1.784 Mg/m$^3$ | |
| Absorption coefficient | 1.437 mm$^{-1}$ | |
| F(000) | 688 | |
| Crystal size | 0.15 × 0.15 × 0.1 mm$^3$ | |
| Crystal color, habit | clear colourless block | |
| Theta range for data collection | 2.198 to 26.382°. | |
| Index ranges | −9 <= h <= 9, −15 <= k <= 13, −17 <= l <= 17 | |
| Reflections collected | 11549 | |
| Independent reflections | 2611 [R(int) = 0.0731] | |
| Completeness to theta = 25.242° | 99.9% | |
| Absorption correction | Semi-empirical from equivalents | |
| Max. and min. transmission | 0.4652 and 0.3891 | |
| Refinement method | Full-matrix least-squares on F$^2$ | |
| Data/restraints/parameters | 2611/0/136 | |
| Goodness-of-fit on F$^2$ | 1.065 | |
| Final R indices [I > 2sigma(I)] | R1 = 0.0332, wR2 = 0.0838 | |
| R indices (all data) | R1 = 0.0361, wR2 = 0.0858 | |
| Absolute structure parameter | 0.00(5) | |
| Extinction coefficient | n/a | |
| Largest diff. peak and hole | 0.360 and −0.510e · Å$^{-3}$ | |

TABLE 12

Atomic coordinates (×10$^4$) and equivalent isotropic displacement parameters (Å$^2$ × 10$^3$) For Example 11, U(eq) is defined as one third of the trace of the orthogonalized U$^{ij}$ tensor.

| | x | y | z | U(eq) |
|---|---|---|---|---|
| Mo(1) | 5728(1) | 5036(1) | 4146(1) | 36(1) |
| Cl(2) | 6796(2) | 6222(1) | 2947(1) | 42(1) |
| Cl(1) | 5665(2) | 3642(1) | 5296(1) | 59(1) |
| O(3) | 7484(4) | 3874(3) | 3290(2) | 33(1) |
| O(4) | 8555(5) | 5286(3) | 4799(3) | 37(1) |
| O(2) | 3868(5) | 4641(4) | 3542(4) | 60(1) |
| O(1) | 4986(7) | 6018(4) | 4890(3) | 63(1) |
| C(6) | 10956(8) | 5056(5) | 5895(4) | 56(2) |
| C(1) | 7073(9) | 2746(4) | 3220(4) | 44(1) |
| C(8) | 9173(9) | 6336(5) | 5068(4) | 54(2) |
| C(2) | 8331(10) | 2315(4) | 2433(4) | 52(2) |
| C(4) | 9009(8) | 4133(5) | 2657(4) | 45(1) |
| C(7) | 10698(10) | 6210(6) | 5705(8) | 97(3) |
| C(3) | 9888(9) | 3099(5) | 2452(5) | 53(2) |
| C(5) | 9912(11) | 4520(5) | 5131(5) | 64(2) |

TABLE 13

Bond lengths [Å] and angles [°] for $MoO_2Cl_2(THF)_2$.

| | |
|---|---|
| Mo(1)—Cl(2) | 2.3575(14) |
| Mo(1)—Cl(1) | 2.3576(15) |
| Mo(1)—O(3) | 2.280(3) |
| Mo(1)—O(4) | 2.300(4) |
| Mo(1)—O(2) | 1.683(4) |
| Mo(1)—O(1) | 1.692(4) |
| O(3)—C(1) | 1.451(6) |
| O(3)—C(4) | 1.462(6) |
| O(4)—C(8) | 1.442(6) |
| O(4)—C(5) | 1.463(8) |
| C(6)—H(6A) | 0.9900 |
| C(6)—H(6B) | 0.9900 |
| C(6)—C(7) | 1.483(9) |
| C(6)—C(5) | 1.469(8) |
| C(1)—H(1A) | 0.9900 |
| C(1)—H(1B) | 0.9900 |
| C(1)—C(2) | 1.526(8) |
| C(8)—H(8A) | 0.9900 |
| C(8)—H(8B) | 0.9900 |
| C(8)—C(7) | 1.438(9) |
| C(2)—H(2A) | 0.9900 |
| C(2)—H(2B) | 0.9900 |
| C(2)—C(3) | 1.516(9) |
| C(4)—H(4A) | 0.9900 |
| C(4)—H(4B) | 0.9900 |
| C(4)—C(3) | 1.478(8) |
| C(7)—H(7A) | 0.9900 |
| C(7)—H(7B) | 0.9900 |
| C(3)—H(3A) | 0.9900 |
| C(3)—H(3B) | 0.9900 |
| C(5)—H(5A) | 0.9900 |
| C(5)—H(5B) | 0.9900 |
| Cl(1)—Mo(1)—Cl(2) | 160.67(6) |
| O(3)—Mo(1)—Cl(2) | 81.43(9) |
| O(3)—Mo(1)—Cl(1) | 83.31(10) |
| O(3)—Mo(1)—O(4) | 76.68(12) |
| O(4)—Mo(1)—Cl(2) | 83.21(10) |
| O(4)—Mo(1)—Cl(1) | 81.78(10) |
| O(2)—Mo(1)—Cl(2) | 96.61(17) |
| O(2)—Mo(1)—Cl(1) | 95.55(17) |
| O(2)—Mo(1)—O(3) | 91.38(18) |
| O(2)—Mo(1)—O(4) | 167.97(18) |
| O(2)—Mo(1)—O(1) | 104.3(2) |
| O(1)—Mo(1)—Cl(2) | 94.13(16) |
| O(1)—Mo(1)—Cl(1) | 97.36(16) |
| O(1)—Mo(1)—O(3) | 164.1(2) |
| O(1)—Mo(1)—O(4) | 87.7(2) |
| C(1)—O(3)—Mo(1) | 122.6(3) |
| C(1)—O(3)—C(4) | 109.8(4) |
| C(4)—O(3)—Mo(1) | 127.3(3) |
| C(8)—O(4)—Mo(1) | 120.9(3) |
| C(8)—O(4)—C(5) | 107.6(5) |
| C(5)—O(4)—Mo(1) | 131.1(4) |
| H(6A)—C(6)—H(6B) | 108.9 |
| C(7)—C(6)—H(6A) | 110.8 |
| C(7)—C(6)—H(6B) | 110.8 |
| C(5)—C(6)—H(6A) | 110.8 |
| C(5)—C(6)—H(6B) | 110.8 |
| C(5)—C(6)—C(7) | 104.7(5) |
| O(3)—C(1)—H(1A) | 110.7 |
| O(3)—C(1)—H(1B) | 110.7 |
| O(3)—C(1)—C(2) | 105.4(5) |
| H(1A)—C(1)—H(1B) | 108.8 |
| C(2)—C(1)—H(1A) | 110.7 |

TABLE 13-continued

Bond lengths [Å] and angles [°] for MoO$_2$Cl$_2$(THF)$_2$.

| | |
|---|---|
| C(2)—C(1)—H(1B) | 110.7 |
| O(4)—C(8)—H(8A) | 110.2 |
| O(4)—C(8)—H(8B) | 110.2 |
| H(8A)—C(8)—H(8B) | 108.5 |
| C(7)—C(8)—O(4) | 107.8(5) |
| C(7)—C(8)—H(8A) | 110.2 |
| C(7)—C(8)—H(8B) | 110.2 |
| C(1)—C(2)—H(2A) | 111.2 |
| C(1)—C(2)—H(2B) | 111.2 |
| H(2A)—C(2)—H(2B) | 109.1 |
| C(3)—C(2)—C(1) | 102.9(5) |
| C(3)—C(2)—H(2A) | 111.2 |
| C(3)—C(2)—H(2B) | 111.2 |
| O(3)—C(4)—H(4A) | 110.7 |
| O(3)—C(4)—H(4B) | 110.7 |
| O(3)—C(4)—C(3) | 105.0(4) |
| H(4A)—C(4)—H(4B) | 108.8 |
| C(3)—C(4)—H(4A) | 110.7 |
| C(3)—C(4)—H(4B) | 110.7 |
| C(6)—C(7)—H(7A) | 110.0 |
| C(6)—C(7)—H(7B) | 110.0 |
| C(8)—C(7)—C(6) | 108.4(6) |
| C(8)—C(7)—H(7A) | 110.0 |
| C(8)—C(7)—H(7B) | 110.0 |
| H(7A)—C(7)—H(7B) | 108.4 |
| C(2)—C(3)—H(3A) | 111.0 |
| C(2)—C(3)—H(3B) | 111.0 |
| C(4)—C(3)—C(2) | 103.7(5) |
| C(4)—C(3)—H(3A) | 111.0 |
| C(4)—C(3)—H(3B) | 111.0 |
| H(3A)—C(3)—H(3B) | 109.0 |
| O(4)—C(5)—C(6) | 106.4(5) |
| O(4)—C(5)—H(5A) | 110.4 |
| O(4)—C(5)—H(5B) | 110.4 |
| C(6)—C(5)—H(5A) | 110.4 |
| C(6)—C(5)—H(5B) | 110.4 |
| H(5A)—C(5)—H(5B) | 108.6 |

Symmetry transformations used to generate equivalent atoms:

TABLE 14

Anisotropic displacement parameters (Å$^2$ × 10$^3$) for MoO$_2$Cl$_2$(THF)$_2$. The anisotropic displacement factor exponent takes the form: −2π$^2$[h$^2$ a*$^2$U$^{11}$ + . . . + 2 h k a* b* U$^{12}$]

| | U$^{11}$ | U$^{22}$ | U$^{33}$ | U$^{23}$ | U$^{13}$ | U$^{12}$ |
|---|---|---|---|---|---|---|
| Mo(1) | 30(1) | 33(1) | 44(1) | −1(1) | 12(1) | 0(1) |
| Cl(2) | 47(1) | 32(1) | 46(1) | 7(1) | −1(1) | 0(1) |
| Cl(1) | 77(1) | 48(1) | 52(1) | 10(1) | 30(1) | −8(1) |
| O(3) | 35(2) | 24(2) | 38(2) | −4(1) | 9(2) | −2(1) |
| O(4) | 43(2) | 25(2) | 42(2) | −5(2) | −5(2) | 0(2) |
| O(2) | 31(2) | 63(3) | 87(3) | 5(3) | 1(2) | −6(2) |
| O(1) | 65(3) | 52(3) | 72(3) | −10(2) | 32(3) | 12(2) |
| C(6) | 43(3) | 66(5) | 59(4) | 2(4) | 4(2) | −6(3) |
| C(1) | 53(3) | 28(3) | 50(3) | −8(2) | −2(3) | −7(3) |
| C(8) | 75(4) | 31(3) | 56(4) | −6(3) | −11(3) | −12(3) |
| C(2) | 80(4) | 33(3) | 42(3) | −8(3) | −7(3) | 16(3) |
| C(4) | 49(3) | 39(3) | 46(3) | −3(3) | 19(3) | 0(3) |
| C(7) | 73(5) | 45(4) | 172(9) | −34(5) | −58(6) | 10(4) |
| C(3) | 58(3) | 42(4) | 59(4) | −1(3) | 20(3) | 10(3) |
| C(5) | 70(4) | 43(4) | 78(5) | −5(3) | −24(4) | 13(3) |

TABLE 15

Hydrogen coordinates (×10$^4$ and isotropic displacement parameters (Å$^2$ × 10$^3$ for MoO$_2$Cl$_2$(THF)$_2$.

| | x | y | z | U(eq) |
|---|---|---|---|---|
| H(6A) | 12249 | 4862 | 5854 | 67 |
| H(6B) | 10496 | 4862 | 6548 | 67 |
| H(1A) | 5794 | 2636 | 3035 | 52 |

TABLE 15-continued

Hydrogen coordinates (×10$^4$ and isotropic displacement parameters (Å$^2$ × 10$^3$ for MoO$_2$Cl$_2$(THF)$_2$.

| | x | y | z | U(eq) |
|---|---|---|---|---|
| H(1B) | 7299 | 2385 | 3848 | 52 |
| H(8A) | 9528 | 6741 | 4481 | 64 |
| H(8B) | 8197 | 6730 | 5404 | 64 |
| H(2A) | 8745 | 1584 | 2591 | 62 |
| H(2B) | 7731 | 2309 | 1790 | 62 |
| H(4A) | 9857 | 4623 | 2988 | 54 |
| H(4B) | 8586 | 4471 | 2048 | 54 |
| H(7A) | 10480 | 6593 | 6324 | 116 |
| H(7B) | 11794 | 6512 | 5398 | 116 |
| H(3A) | 10766 | 2913 | 2968 | 64 |
| H(3B) | 10521 | 3115 | 1817 | 64 |
| H(5A) | 10710 | 4310 | 4586 | 76 |
| H(5B) | 9322 | 3872 | 5392 | 76 |

The table below illustrates the various physical properties for certain compounds of Formula (I):

| | | STA-DSC | | |
|---|---|---|---|---|
| Compound | M.P. | T$_{50}$ (° C.) | Residual Mass (%) | Example Number |
| MoO$_2$Cl$_2$(DME) | 128.4 | 184.4 | 1.69 | 1 |
| MoO$_2$Cl$_2$(DMM) | | 200.4 | 46.36 | 2 |
| MoO$_2$Cl$_2$(1,2-DMP) | 131.8 | 185.0 | 40.89 | 3 |
| MoO$_2$Cl$_2$(DMA)$_2$ | 124.7 | 238.3 | 17.06 | 4 |
| MoO$_2$Cl$_2$(DMF)$_2$ | 162.6 | 232.0 | 9.93 | 5 |
| MoO$_2$Cl$_2$(MeCN)$_2$ | 112.4 | 143.5 | 2.61 | 6 |
| MoO$_2$Cl$_2$(tBuCN)$_x$ | 95.3 | 135.7 | 4.55 | 7 |
| MoO$_2$Cl$_2$(iPrCN)$_x$ | 69.9 | 134.1 | 3.15 | 8 |
| MoO$_2$Cl$_2$(DMCA) | | n/a | 64.45 | 9 |
| MoO$_2$Cl$_2$(TMEN) | | n/a | 57.12 | 10 |
| MoO$_2$Cl$_2$(THF)$_2$ | | 138.1 | 18.77 | 11 |

Abbreviations

DME = 1,2-dimethoxyethane
DMM = 1,2-dimethoxymethane
1,2-DMP = 1,2-dimethoxypropane
DMA = N,N-dimethylacetamide
DMF = N,N-dimethylformamide
DMCA = N,N-dimethylcyanoacetamide
TMEN = N,N,N',N',-tetramethylethylenediamine
CN = nitrile
THF = tetrahydrofuran STA-DSC:
simultaneous thermal analysis—differential scanning calorimetry

We claim:
1. A process for preparing compounds of the Formula (I)

(I)

wherein M is molybdenum, X is chosen from fluoro, chloro, bromo, and iodo, and each L$_1$ and L$_2$ are the same or different and constitute:

(i) a monodentate hydrocarbyl ligand coordinated with M, or (ii) are taken together to form a bidentate hydrocarbyl ligand coordinated with M;

which comprises:

(A) contacting a compound of the formula with (a) water containing about 0.1% (w/w) to about 48% (w/w) of a compound of the formula HX, and (b) a compound of the formula $L_1$ and/or $L_2$; followed by (B) extraction of the compound of Formula(I) with a non-coordinating, water immiscible solvent, and isolation of the compound of Formula (I) as a solid or liquid.

2. The process of claim 1, wherein X is fluoro.

3. The process of claim 1, wherein X is chloro.

4. The process of claim 1, wherein X is bromo.

5. The process of claim 1, wherein X is iodo.

6. The process of claim 1, wherein $L_1$ and $L_2$ are dimethoxyethane.

7. The process of claim 1, wherein the non-coordinating, water-immiscible solvent is dichloromethane, ethyl acetate, diethyl ether, toluene, benzene, or pentane.

8. The process of claim 6, wherein the non-coordinating, water-immiscible solvent is dichloromethane.

* * * * *